United States Patent
Wallaschek et al.

(10) Patent No.: US 6,427,897 B2
(45) Date of Patent: Aug. 6, 2002

(54) FEED UNIT FOR MOVING PARTS

(75) Inventors: Jörg Wallaschek, Paderborn; Frank Walther, Brakel; Hans Jürgen Hesse, Paderborn, all of (DE)

(73) Assignee: Hess & Knipps GmbH (DE)

( * ) Notice: Subject to any disclaimer, the term of this patent is extended or adjusted under 35 U.S.C. 154(b) by 33 days.

(21) Appl. No.: 09/733,890

(22) Filed: Dec. 8, 2000

Related U.S. Application Data

(63) Continuation of application No. PCT/DE99/00034, filed on Jan. 5, 1999.

(30) Foreign Application Priority Data

Jun. 9, 1998 (DE) ....................................... 298 10 313 U

(51) Int. Cl.⁷ .............................. B23K 1/06; B23K 5/20; B23K 37/00
(52) U.S. Cl. ........................ 228/1.1; 228/4.5; 228/44.3
(58) Field of Search ..................... 228/1.1, 4.5, 44.3, 228/44.7, 49.1, 49.5

(56) References Cited

U.S. PATENT DOCUMENTS

| | | | | |
|---|---|---|---|---|
| 4,226,507 A | * | 10/1980 | Fuschetto | 359/849 |
| 4,302,071 A | * | 11/1981 | Winzer | 385/25 |
| 4,319,345 A | * | 3/1982 | Dennis | 181/104 |
| 4,653,681 A | | 3/1987 | Dreibelbis et al. | 228/4.5 |
| 4,705,981 A | * | 11/1987 | Inoue et al. | 310/322 |
| 4,769,569 A | * | 9/1988 | Stahlhuth | 310/328 |
| 4,825,894 A | * | 5/1989 | Cummins | 137/82 |
| 5,341,687 A | * | 8/1994 | Stan | 73/146 |
| 5,777,423 A | | 7/1998 | Zumeris | 310/323 |
| 5,900,691 A | | 5/1999 | Reuter et al. | 310/348 |
| 5,942,837 A | * | 8/1999 | Reuter | 310/328 |

FOREIGN PATENT DOCUMENTS

| | | |
|---|---|---|
| EP | 0729193 | 8/1996 |
| WO | 9824583 | 6/1998 |

* cited by examiner

*Primary Examiner*—Tom Dunn
*Assistant Examiner*—Zidia Pittman
(74) *Attorney, Agent, or Firm*—Baker Botts LLP

(57) ABSTRACT

A feed unit for moving parts over short distances has a four-bar chain forming a translating solid parallelogram having two parallel rigid opposite legs, one of which constitutes a base leg, connected to one another by elastic elements and a piezoelectric stack translator extending between and flexibly connected to the rigid legs for articulation relative to the rigid legs and oriented at an angle of incidence ($\alpha$) with respect to a base leg that is less than 90° and greater than 45°.

10 Claims, 2 Drawing Sheets

FEED UNIT FOR MOVING PARTS

REFERENCE TO PRIOR APPLICATION

The present application is a continuation of International (PCT) Application No. PCT/DE99/00034, filed Jan. 5, 1999 (Publication No. WO 99/64197, published Dec. 16, 1999), which is incorporated herein for all purposes.

BACKGROUND OF THE INVENTION

The present invention relates to a feed unit for moving any desired parts over short distances, such as for moving wire clamps or wire grippers on wire bonders and, more particularly, for feeding the bonding wire by means of wire clamps or wire grippers on ultrasonic wire bonders.

In ultrasonic wire bonding, for which aluminum wire is generally used, each contact (bond) on the bond islands (bond pads) of a semiconductor chip or a substrate is produced using a wedge bonding tool (wedge), whose technical construction is generally known. A number of steps are required to implement a complete bonding cycle, e.g., to produce a wire jumper between the bond pads. To make it possible to perform these steps, the wedge is provided with a wire gripper, also known as a filament clamp, by means of which the bonding wire can, depending on the current process step, either be held in place or advanced toward the wedge or moved away from the wedge in order to sever the bonding wire from the second contact.

During this process, it is necessary prior to forming the first bond of each wire jumper to initially advance the bonding wire under the working surface of the wedge, hence to produce a tail that facilitates execution of the first bond. After forming the bond on the first contact, the wire jumper is pulled to the second contact in the form of a loop, and the free end of the bonding wire is broken off in a defined manner after execution of the second bond.

The required tail length itself is a function of the geometric relationships of the wedge and the bond pad. If the tail is too long, the danger of short circuits to neighboring bond pads exists. If, on the other hand, the tail is too short, a faulty bond will be produced under certain circumstances.

While the wire jumper is being pulled to the second bond contact, the wire gripper must release the bond wire so that the wire can be drawn from a supply spool. After reaching or slightly overshooting the second bond point, the bonding wire must be held fast again so that the necessary loop can be laid and the bonding wire can be broken off after forming of the second bond. While the length of the break-off stroke after the second bond is not critical for the bond itself, it is a contributing factor in determining the overall cycle time.

Prior art drives for wire grippers can be divided into two basic categories, namely, so-called mechanically contacting drives, such as cam-type drives and the like, on the one hand, and on the other hand, non-contacting drives, such as magnetic drives, in which the wire grippers themselves must be supported by suitable guides such as linear guides.

Mechanically contacting drives are characterized by long possible actuating distances at relatively low actuating speeds and high maintenance costs as a consequence of the unavoidable wear.

Moving-coil drives and voice-coil drives come into consideration as examples of non-contacting drives. However, as a result of the limitations on space in the vicinity of the bonding head, it is necessary for such drives to be as compact as possible. This circumstance has the result that these drives cannot be made very mechanically stiff; as a result, they can easily be deflected from their initial position during rapid movements of the bonding head such as those which are encountered in wire bonders with rotatable bonding heads. This deflection can then lead to errors in subsequent movements and also to positioning problems. A further disadvantage of drives of this type is that, when constructed in compact form, they can produce only small actuating forces. Moreover, with such drives it is necessary to work with rigid stops, which are subject to significant wear and also results in the need for the rigid stops to be made adjustable, which in turn significantly increases the adjustment and maintenance cost.

Such a magnetic drive is known, for example, from WO 98/24583 A1. The drive and location positioning of the wire gripper here are performed bidirectionally from a zero position against the spring force of leaf springs with the aid of a linear drive that is connected to program control of the wire bonder and takes the form of a moving-coil drive, a linear motor, or a piezo drive that directly couples the moving elements of the straight-line mechanism to one another.

A previously known piezoelectrically-actuated drive and adjustment element, as described in U.S. Pat. No. 5,900,691, has two piezoelectric stack translators arranged adjacent to one another, the lower end of each being connected to a leg by a solid joint. The upper ends of the stack translators are attached to a rigid traverse bar that is in turn connected to an upper leg by a solid joint. The two legs are connected to one another to form a solid parallelogram.

When the two stack translators are subjected to different electric potentials, a lateral deflection of the solid parallelogram is accomplished. The size of the lateral deflection is determined by the applied electric potential and the potential difference between the two stack translators.

A drive or adjustment element of this type is of very complex construction and hence is expensive to manufacture.

An object of the present invention is to provide a feed unit that is economical to manufacture, ensures adequate system stiffness, and facilitates precise and rapid electrically programmable positioning of the component to be moved.

The foregoing object is attained, in accordance with the present invention, by a feed unit for moving parts over short distances that has a four-bar chain forming a translating solid parallelogram having two parallel rigid opposite legs, one of which constitutes a base leg, connected to one another by elastic elements. A piezoelectric stack translator extends between and is flexibly connected to the rigid legs for articulation relative to the rigid legs and is oriented at an angle of incidence ($\alpha$) with respect to a base leg that is less than 90° and greater than 45°.

A feed unit according to the invention can be cost-effectively manufactured and has a high system stiffness even at small sizes, which is achieved, in particular, through the use of the piezoelectric stack translator in combination with the solid parallelogram.

With a drive unit of this type, any desired position within the actuating range can be preset as the zero or starting position through electrical actuating variables. Furthermore, all stops can be eliminated with a drive unit of this type.

To avoid parts that move relative to one another and thus cause wear, it is advantageous for the stack translator to be connected in the vicinity of its ends to the solid parallelogram by solid joints.

In order to keep assembly and manufacturing costs to a minimum, the solid joints are joined to the solid parallelogram as a single part and in addition each has one mounting element for the stack translator.

In a refinement of the invention, the stack translator is frictionally clamped between the mounting elements. A glued connection can additionally be provided.

The solid parallelogram is further characterized in that the rigid parallel legs are connected to one another by elastic elements that are designed as solid elastic elements, preferably formed by recesses in the solid parallelogram which form flexible couplings.

The lowest manufacturing and assembly cost is achieved when the solid parallelogram is constructed as a single piece, which can be accomplished by machining the solid parallelogram from a metal plate by milling or erosion.

In one variant, the solid parallelogram can also be embodied as multiple pieces, where leaf springs or leaf-spring-like elements are arranged between the rigid legs as the elastic elements. A further advantageous refinement of the invention is characterized in that a wire clamp is attached directly to a rigid leg of the translating solid parallelogram and that the other rigid leg is attached to the bonding head.

Rapid and precise positioning of the wire clamp or other components with high actuating force can be implemented with the feed unit in accordance with the invention, where positioning in a simple manner is possible through the provision of electrical actuating variables. In combination with an electrical control loop, position control of the wire clamp can be implemented easily and without the need for troublesome solid stops.

This has the particular advantage that alteration of the tail length and the break-off stroke can now be accomplished exclusively by programmatic means and the time-consuming adjustment steps previously required can be completely eliminated. A significant improvement in the operational properties of the bonder is thus achieved by simple technical means, since working on solid stops is avoided. This means that the time for setting up the system that is otherwise necessary after moving into stops can be saved, which results in further advantages.

This means that all bond parameters that are affected by the wire clamp and its movement can now be predetermined by the feed unit in accordance with the invention by means of program control of the bonder.

DESCRIPTION OF THE DRAWINGS

The description below and the accompanying drawings explain and show an embodiment of a feed unit in accordance the invention.

Figure 1:
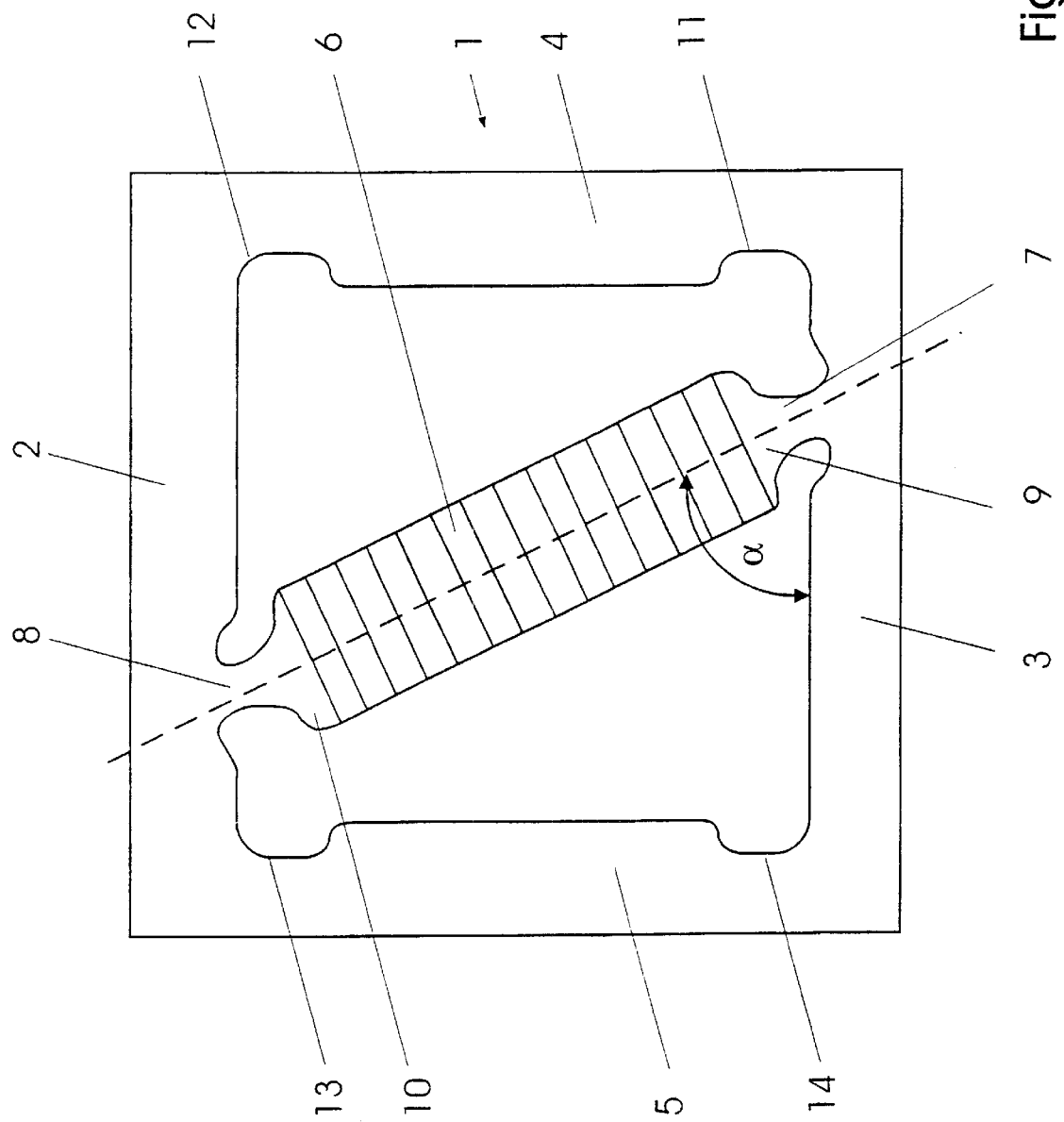
FIG. 1 shows a schematic representation of the embodiment.

The feed unit 1 of the embodiment shown in FIG. 1 consists of a translating solid parallelogram 1 that has two rigid legs 2, 3 that are parallel to one another and are connected to one another by elastic elements 4, 5. The elastic effect is implemented through recesses 11, 12, 13, 14 in the elastic elements 4, 5. The recesses 11, 12, 13, 14 are worked directly into the transition to the legs 2, 3, and act as solid joints with elastic properties.

Located within the translating solid parallelogram 1 as a drive element is a piezoelectric stack translator 6, which extends across the solid parallelogram 1 at a predetermined angle of incidence α with respect to the base leg 3 that is less than 90° and greater than 45°, and is attached to the rigid legs 2 and 3 of the solid parallelogram 1 at solid joints 7, 8, which are flexible to permit articulation of the stack translator relative to the rigid legs. The specific angle to be provided in an individual case depends on the relevant application conditions. In principle, it is to be assumed that an angle of incidence of nearly 90° results in the maximum possible deflection, where of course significantly larger forces must be generated by the stack translator 6 than in the case of a flatter arrangement of the stack translator 6, as for example at 45°.

Mounting elements 9, 10 are provided at the articulating joints 7, 8 to mount the stack translator 6, which is frictionally clamped between said elements. A glued connection can additionally be provided.

All components of the solid parallelogram 1—i.e., in other words the rigid legs 2, 3, the elastic elements 4,5 with the recesses 11, 12, 13, 14, the solid joints 7, 8, and the mounting elements 9, 10, are executed as one piece, which facilitates cost-effective manufacture without adjustment work.

Figure 2:
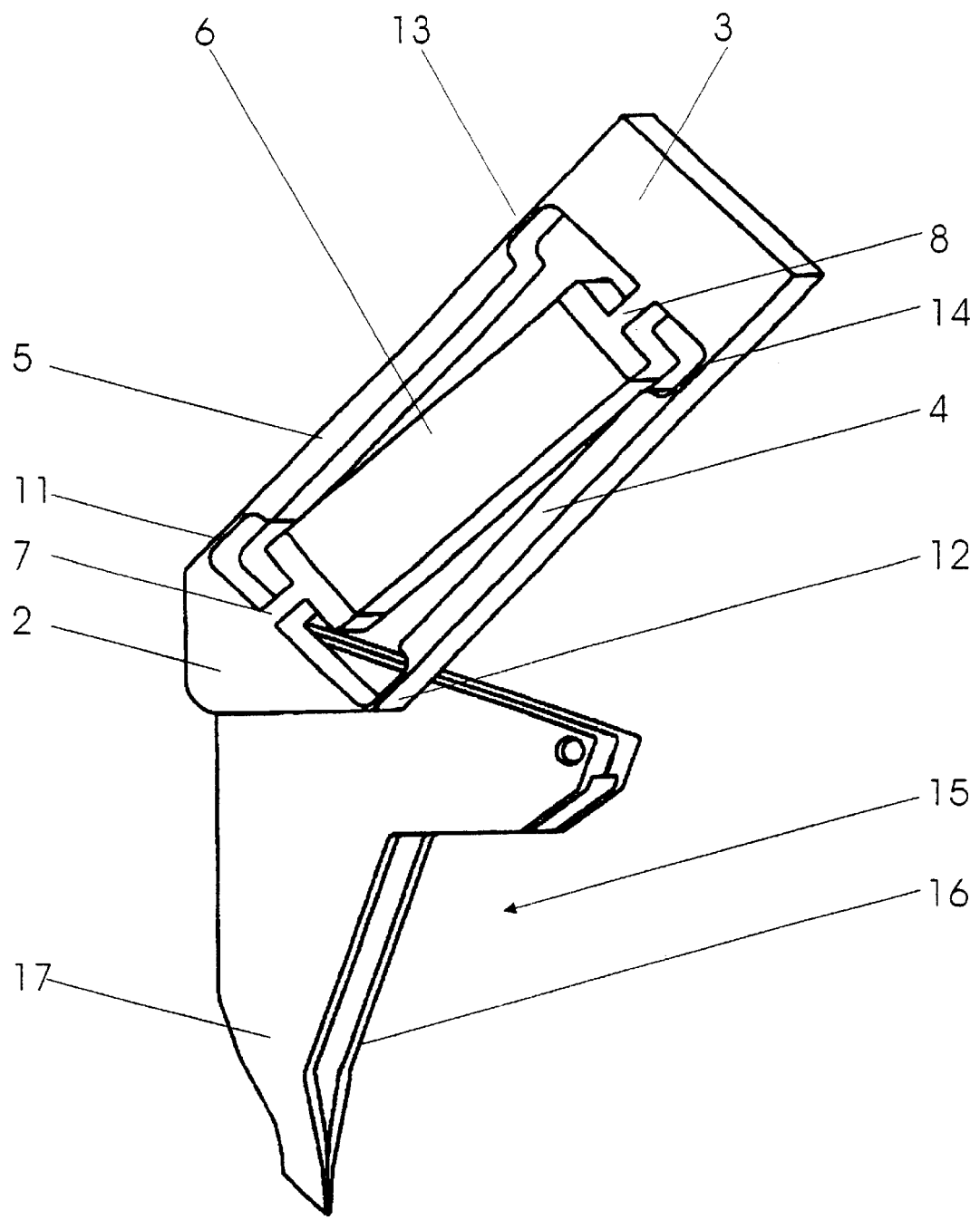
FIG. 2 shows the feed unit from FIG. 1 with a wire gripper attached thereto.

The high stiffness of the feed unit, in combination with the electrically programmable changes in length of the stack translator, facilitates an extremely precise positioning of, for example, a wire clamp 15 (see FIG. 2) that is connected to the feed unit and that has clamp jaws 16, 17, where one of the clamp jaws 16; 17 is attached directly to the feed unit. Since considerable forces can be generated piezoelectrically, the feed unit in accordance with the invention in combination with the high system stiffness is especially suitable for use in fast rotary-head bonders.

In place of the above-described solid parallelogram 1, other embodiments of four-bar chains, for example trapezoidal four-bar-chains, can also be used in combination with a stack translator.

What is claimed is:

1. A feed unit for moving parts over short distances, comprising a four-bar chain forming a translating solid parallelogram having two parallel rigid opposite legs, one of which constitutes a base leg, connected to one another by elastic elements, and a piezoelectric stack translator extending between and flexibly connected to the rigid legs for articulation relative to the rigid legs and oriented at an angle of incidence ($\alpha$) with respect to a base leg that is less than 90° and greater than 45°.

2. The feed unit in accordance with claim 1, wherein the stack translator is flexibly connected in the vicinity of its ends to the rigid legs of the solid parallelogram by solid joints.

3. The feed unit in accordance with claim 2, wherein the stack translator is connected to mounting elements supported by the solid joints, and the mounting elements and solid joints are unitary with the solid parallelogram.

4. The feed unit in accordance with claim 3, wherein the stack translator is frictionally clamped between the mounting elements.

5. The feed unit in accordance with any one of claims 1 through 4, wherein the rigid legs are connected to one another by solid elastic elements.

6. The feed unit in accordance with claim 5, wherein the solid elastic elements are recesses in members of the parallelogram connected between the rigid legs.

7. The feed unit in accordance with claim 6, wherein the four-bar chain is single piece.

8. The feed unit in accordance with claim 7, wherein the four-bar chain is machined from a metal plate by milling or erosion.

9. The feed unit in accordance with claim 1, wherein the four-bar chain has multiple pieces, the elastic elements and the rigid legs being separately formed.

10. The feed unit in accordance with claim 1, wherein a wire clamp is attached directly to one of the rigid legs of the translating solid parallelogram and the other rigid leg is attached to a bonding head of an ultrasonic wire bonder.

* * * * *